United States Patent [19]

Pfleiderer

[11] 4,031,315

[45] June 21, 1977

[54] SOLID BODY IMAGE SENSOR HAVING CHARGE COUPLED SEMICONDUCTOR CHARGE SHIFT ELEMENTS AND METHOD OF OPERATION

[75] Inventor: Hans-Jöerg Pfleiderer, Zorneding, Germany

[73] Assignee: Siemens Aktiengesellschaft, Berlin & Munich, Germany

[22] Filed: Sept. 9, 1975

[21] Appl. No.: 611,624

[30] Foreign Application Priority Data

Sept. 27, 1974 Germany .......................... 2446232

[52] U.S. Cl. ............................... 358/212; 357/24; 357/30; 358/213
[51] Int. Cl.² .................. H04N 3/14; H01L 29/78; H01L 27/14
[58] Field of Search .................. 178/7.1; 250/211 J, 250/578; 357/30, 24

[56] References Cited

UNITED STATES PATENTS 3,890,633  6/1975  Kosonocky ........................ 357/30

*Primary Examiner*—John C. Martin
*Attorney, Agent, or Firm*—Hill, Gross, Simpson, Van Santen, Steadman, Chiara & Simpson

[57] ABSTRACT

An image sensor has image elements arranged in matrix form. Each of the elements possesses a pair of electrode arrangements comprising a first and a second electrode arrangement. The elements are photosensitive and form charge coupled shift registers in rows and columns. The first electrode arrangement of the pairs of electrode arrangements is, in each case, connected to a first control line and a second electrode arrangement of the pairs of electrode arrangements is connected to a second control line, the two control lines of a row or column may be connected by way of switches to drive lines and the switches may be operated by drive registers. The image sensor has output coupling devices for row-by-row and column-by-column output coupling. For a one-phase mode of operation, the first and second control lines of two adjacent rows and columns of image elements in each case form a first (second) common control line so that a first and a second common control line is connected to all the first and second pairs of electrodes of respective pairs of adjacent rows and columns, two pairs of drive lines are provided and each of the first control lines may be connected by way of switches to each of the two drive lines of the first pair of drive lines and each of the second control lines may be connected by way of switches to each of the two drive lines of the second pair of drive lines so that common control lines which are adjacent each other may be connected, in each case, to different pairs of drive lines.

2 Claims, 2 Drawing Figures

SOLID BODY IMAGE SENSOR HAVING CHARGE COUPLED SEMICONDUCTOR CHARGE SHIFT ELEMENTS AND METHOD OF OPERATION

BACKGROUND OF THE INVENTION

1. Field of the Invention

This invention relates to a solid body image sensor having charge coupled semiconductor charge shift elements with image elements arranged in the form of a matrix, and more particularly to such a sensor in which each of the image elements has a pair of electrode arrangements featuring a first and a second electrode arrangement and which are photosensitive, wherein the image elements form charge coupled shift registers in the form of rows and columns and in which the first electrode arrangement of the pairs of electrode arrangements is, in each case, connected to a first control line and the second electrode arrangement of the pairs of electrode arrangements is, in each case, connected to a second control line, wherein the two control lines of a row or column can, in each case, be connected by way of switches to drive lines, and wherein the switch can be driven by drive registers, and having output coupling devices for row-by-row and column-by-column output coupling of the device, and wherein the invention further relates to an operative process for such a sensor.

2. Description of the Prior Art

It is known in the art to utilize shift registers with charge coupled charge shift elements (CCD elements) for image sensors, as disclosed in the German published application 2,107,110 which is equivalent to the British Pat. No. 1,340,617. In this arrangement, individual charge shift elements which are to be thought of as being combined in groups, form image elements which respond to electromagnetic radiation, in particular to optical radiation. These charge shift elements are organized into row-by-row shift registers and are constructed in a common substrate body, the substrate body covering the entire radiation-sensitive image surface. The electromagnetic radiation which enters the substrate body produces electric charges in the region of the charge shift elements, which charges are advanced in one direction from one element to the next adjacent element by timing pulses conventionally used for shift registers having charge shift elements. At the end of the shift register, the displaced charges are received by output coupling devices. The time sequence of the charge pulses received in the output coupling devices corresponds to the image brightness distribution of the row belonging to the relevant shift register. By arranging a plurality of rows one below another it is possible to form an image surface in which the image elements, consisting of charge shift elements, are arranged in matrix or raster form.

The term "charge-shift elements" is explained in, for example, the following publications: "Bell System Technical Journal", (1970), p. 587 ff; "Applied Physics Letters", Vol. 17, (1970), p 111 ff; and the German published application No. 2,201,150, and therefore a further definition of the term is not thought to be necessary herein. Other details, in particular regarding image sensors, can be obtained from the "Journal Vac. Sci. Technology", Vol. 9, (1972), p. 1166 ff. The last-mentioned publication, in particular on Page 1175 in FIG. 24, schematically describes an image sensor having charge shift elements organized in rows. The rows of charge shift elements arranged one above another are schematically illustrated: a drive device for 2-phase operation of the image sensor and an output coupling device, both shown only in a block circuit diagram, however. Details of a known device of this type are, however, also basically already known in the art.

In addition to the image sensor outlined in FIG. 24 of the above-mentioned publication, exhibiting row-by-row organization in row-by-row read-out in an output coupling device and in an output register, other image sensors are also known, e.g. from FIG. 23 of the publication which is an image organized image sensor frame transfer principle, in which entire image rows are output coupled at the same time, and it is also possible to provide an intermediate storage before the final analysis.

SUMMARY OF THE INVENTION

Although the prior art discloses a number of possible image sensors, the primary object of the invention is to provide an image sensor which is improved in relation to the prior art and which, in particular, facilitates as high as possible a surface-proportionate exploitation of the raster surface or substrate surface available for the image.

The above object is realized in an image sensor having image elements arranged in matrix form, each of which possesses a pair of electrode arrangements comprising a first and a second electrode arrangement, and which are photosensitive. The image elements form charge coupled shift registers in rows and columns. The first electrode arrangement of the pairs of electrode arrangements is, in each case, connected to a first control line and the second electrode arrangement of the pairs of electrode arrangements is connected to a second control line. The two pulse train lines of a row or column may be connected by way of switches to drive lines, the switches being operable by drive registers. Output coupling devices are provided for rwo-by-row and column-by-column output coupling.

More specifically, and for a one-phase mode of operation, the first and second control lines of two adjacent rows and columns of image elements in each case form a first (second) common control line so that a first and a second common control line is connected to all the first and second pairs of electrodes of, in each case, two adjacent rows and columns. Two pairs of drive lines are provided and each of the first control lines may be connected by way of switches to each of the two drive lines of the first pair of drive lines and each of the second control lines may be connected by way of switches to each of the two drive lines of the second pair of drive lines, so that common control lines which are adjacent to one another may be connected, in each case, to different pairs of drive lines (a row jump).

The operation of an image sensor may be characterized in that for the pulsed read-out of a shift register consisting of image elements in a row or column, in the row of column which is to be read out the one of the pulse train lines to which one of the electrode arrangements of the pairs of electrode arrangements of the shift register are connected is subjected to a pulse train ($\phi_t$), the other of the control lines to which the others of the electrode arrangements of the pairs of electrode arrangements of the shift register are connected have a potential ($\phi_U$) applied thereto, and the other control lines are connected to potentials ($\phi_0$ and $\phi_2$), adjacent control lines carrying different numbers of the potentials $\phi_0$ and $\phi_2$), and the control potential changes at the maximum between the values ($\phi_1$ and $\phi_2$) in accordance with the read-out pulse train, wherein the following condition applies:

Substrate Potential $\geq \phi_0 > \phi_1 > \phi_U > \phi_2$ for n-conducting substrate Substrate Potential $\leq \phi_0 > \phi_1 > \phi_U > \phi_2$ for p-conducting substrate where the mathematic symbols $>$ and $<$ relate to the number from $-\infty$ to $+\infty$. The substrate may therefore have a potential which is smaller than (p-substrate) or greater than (n-substrate) $\phi_0$.

Column-wise read-out can also replace a row-wise readout as usually provided in television images.

BRIEF DESCRIPTION OF THE DRAWING

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
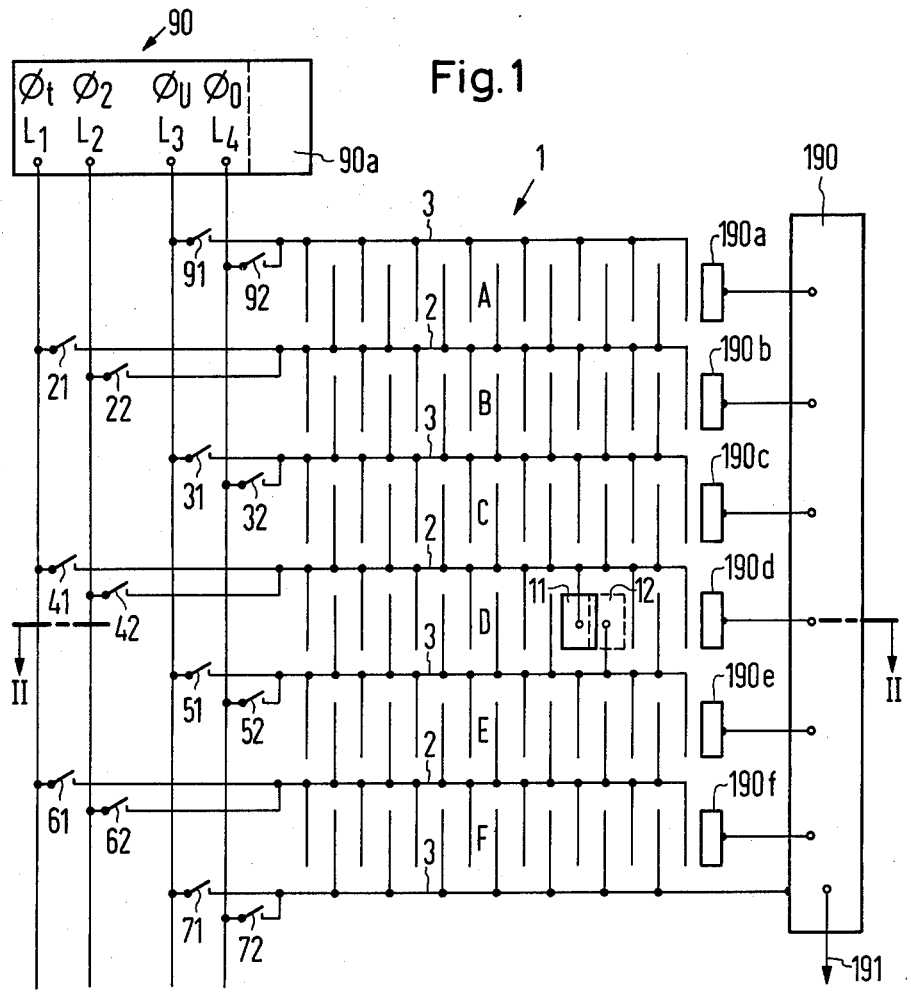
FIG. 1 is a schematic plan view of an image sensor constructed in accordance with the invention which is organized in rows.
Figure 2:
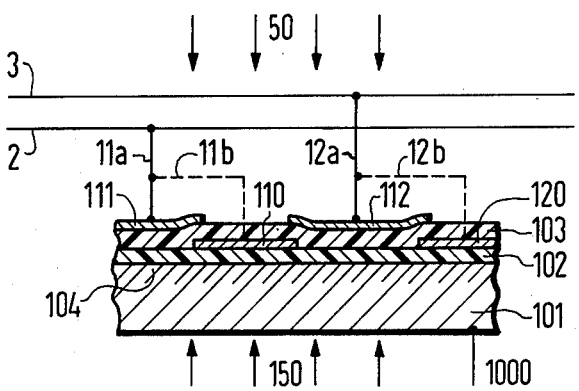
FIG. 2 is a sectional view taken substantially alone the line II—II of FIG. 1, the view having been enlarged for clarity.

Referring to FIGS. 1 and 2, FIG. 1 illustrates a plan view of an image sensor constructed in accordance with the invention which is row organized for image elements arranged in raster form, wherein each image element comprises, for example, two, first and second electrode arrangements which form a pair of electrode arrangements.

FIG. 1 itself illustrates the connection lines for the electrode arrangements of the image elements in schematic form. A first electrode arrangement 11 and a second electrode arrangement 12 (shown in broken lines) are schematically illustrated only for two connection lines. The two electrode arrangements 11 and 12, which form an image element, are fundamentally represented in a side view in FIG. 2, according to a section II—II of FIG. 1, in an enlarged manner for clarity. The electrode arrangement 11 comprises two electrodes 110 and 111 and the electrode arrangement 12 comprises two electrodes 112 and 120. As is usual for known 2-phase shift registers with charge coupled elements, the electrodes 110 and 111, and also 112 and 120, are arranged in stages at different levels to one another. Between these electrodes and the substrate body, which preferably consist of n-or p-conducting silicon and on or in which the image sensor in accordance with the invention is constructed, are arranged one or more layers referenced 102 and 103 and comprising electrically insulating material such as, e.g. silicon dioxide. The one electrode arrangement 11 is connected to a first control line 2 and the other electrode arrangement 12 is electrically connected to a second control line 3. FIG. 2 schematically indicates this connection by virtue of the connection lines 11a and 12a. Also, the electric connections 11b, 12b between the electrodes 110, 111 and 120, 112 are indicated by broken lines. These electrical connections are constructed in a known manner in accordance with the integrated technique provided for the image sensor in accordance with the invention. For example, the connections 11b, 12b can be effected with contact holes in the layer 103.

The electromagnetic radiation which is to be received by and analyzed by the image sensor in accordance with the invention can be irradiated into the substrate body 101 from above (see the arrows 50) or from below (see the arrows 150) or from both of these sides. For the irradiation indicated by the arrows 150, the substrate body 101 must be, for example, sufficiently thin to enable the radiation to penetrate into the surface zone 104, indicated by shading and adjoining the layer 102, of the substrate body 101 in order, in the surface zone 104, to produce charge carriers in a known manner by means of the formation of pairs of charge carriers. To provide irradiation in accordance with the arrows 50, for example, again as known per se, the electrodes, in particular the electrodes 110 and 120 must be provided with polycrystalline silicon, a thin layer which can be penetrated, for example, by optical radiation, and in fact also visible radiation so that radiation in accordance with the arrows 50 can also penetrate into the surface zone 104. The insulation layers 102 and 103 which consists, for example, of silicon dioxide are generally sufficiently highly transmissive for radiation which is liable to be used. If the transmissiveness of the electrodes 110 and 120 is considered to be adequate, the electrodes 111 and 112 can then be in the form of non-transmissive metal electrodes, e.g. consisting of aluminum.

From the aforementioned prior art it is basically known which measures can be used to displace the charge carriers produced in the surface zone 104 beneath the electrodes by the radiation 50, 150, after the 2-phase operation in accordance with a shift register.

In accordance with a primary feature of the invention, however, a single-phase operation is provided for the image sensor in accordance with the invention, i.e. for charge shift. A general description of single-phase operation is provided in a different context of charge shift elements in the publication "IEEE Journal of Solid-State Circuits" (1972), p. 92 ff. In order to exploit this operation which is known per se for an image sensor fulfilling the objects of the present invention, it was necessary to find a particularly selected drive plan for the connection lines 2 and 3, referred to as first and second control lines, of the image elements, i.e. it was necessary to discover a new drive principle for these control lines and a new operating process. Details of these new features will be explained in the following making reference to the schematic illustration of FIG. 1.

According to a feature of the invention, control lines of different, and in fact adjacent rows A, B and B, C and C, D and D, E and E, F form common control lines 2 and 3. Only the pulse train lines 3 of rows A and F—which in the represented exemplary embodiment of the invention are not accompanied by any other further outlying (in relation to the raster of the image sensor)— are the sole control lines of just one row, the row A and the row F. As in FIG. 2, also in FIG. 1 the electrode arrangement 11 is connected to the control line 2 and the electrode arrangement 12 is connected to the control line 3. From these explanations, an essential advantage of the invention will already have become apparent, namely that only one single control line is provided between all adjacent rows, e.g. C and D, D and E. In corresponding image sensors with 2-phase operation, more than one control line would be required at least in the half of the interspaces between adjacent rows having electrodes, such as the electrodes 11 and 12. The advantage that, in accordance with the invention, only one control line is required in such an interspace, allows an optimum exploitation of the total surface of the raster-like image sensor. That is to say, that the optimum raster surface is available for the image elements. In this connection, it should be pointed out that for a construction as already described above of the control lines for the electrodes 110, 111 and 112, 120 it can also be provided that the electrodes 110 in the plane between the layers 102 and 103, on the one hand, and the electrodes 111 on the layer 103, on the other hand, are connected to one another by lines (such as a line 2), and that these lines are in each case connected to one another only at the end of a row by a contact hole which passes through the layer 103. This electrical division of the control line which, for example, is referenced 2 requires no further surface space, as those two parallel individual control lines (which together form the represented control line 2) can be conducted to lie one above another, in which case they are separated from each other only by the layer 103. In such an embodiment, connections such as the connection entered in broken lines in FIG. 2 between the electrodes 110 and 111 can be dispensed with. The same design principle in the integrated circuit technique can be used with equal success for the control line 3 and the electrodes 120 and 112.

According to another unique feature of the invention, as already mentioned above, the control line 2 can be connected by way of switches 21, 22 and 41, 42 and 61, 62—as illustrated in FIG. 1—optionally to one of the two drive lines $L_1$, $L_2$ of the first pair of drive lines. Correspondingly, the control lines 3 can be connected by way of the switches 91, 92 and 31, 32 and 51, 52 and 71, 72 optionally to the drive lines $L_3$ and $L_4$ of a second pair of drive lines. The potentials required for one-phase operation, to be described in the following, of an image sensor constructed in accordance with the invention can be connected by a drive system 90 via the drive lines $L_1$ to $L_4$ to the control lines 2 and 3, these potentials being related, for simplicity, to the potential of a substrate terminal 1000 (see FIG. 2).

The drive system 90 comprises a component which contains a drive register 90a for the switches 21, 22 and 31, 32 and 41, 42 and 51, 52 and 61, 62 and 71, 72 and 91, 92. Since, as already described in detail in the description of the mode of operation, the switches are switched consecutively for the drive and from the read-out in a time sequence, a shift register, for example in the form of a charge coupled shift register, can be used for the drive register 90a for the switches. For the sake of clarity, connection lines have been omitted between the switches and the drive register 90a in FIG. 1, as the provision of such connection lines would be well understood to those versed in the art.

In the integrated technique, it is, for example, advantageous to arrange the drive register 90a, together with the drive system 90 and the transistors for the switches 21-92 on the substrate body which is designed as a chip, e.g. as in the schematic illustration in FIG. 1, at one edge of the raster-like field of the image elements of the image sensor. In a corresponding integrated technique, another side—in FIG. 1 for example the right-hand side—can be provided with an output coupling device 190 constructed in integrated technique, the output coupling device 190 being connected to output coupling arrangements for each individual row, which arrangements are well known per se for charge shift registers. In FIG. 1, output coupling arrangements of this kind which are, e.g. drain zones in the substrate body, are referenced 190a to 190f. These drain zones are electrically connected to the output coupling device by electrical connections, as shown on the drawing. The output coupling device 190 can be a charge shift register. Then, the diffusion zones 190a–190f can be eliminated. The output coupling device 190 has an output 191 as is well known in the art for image sensors (see FIG. 24 of the above-mentioned publication).

An image sensor constructed in accordance with the invention is operated in the manner described in the following. In accordance with the principle of one-phase operation, for the readout of a row only one pulse train potential is provided which at any one time is connected only to one of the control lines 2 or 3, for example to the control line 2 in the row D. In this case, the control potential is a rectangular pulse voltage which alternates in pulsed fashion between the two potential values $\phi_1$ and $\phi_2$. When this pulse train $\phi_t$ is connected to the control line 2 of the row D, the potential is carried, for example, by the electrode arrangement 11. This connection of the pulse train is effected, e.g. via the line $L_1$, when the switch 41 is closed. At this time, the switch 42 is open. For example, as a result of the closure of the switch 51, when the switch 52 is open, the potential $\phi_U$ which is a constant steady potential is connected by way of the line $L_3$ to the electrode arrangement 12, i.e. to the control line 3 in the row D. As is known, with the connected pulse train potential, the charge carriers produced in the region of the individual image elements as a result of the radiation 50 and/or the radiation 150 are shifted in the direction toward the output coupling device 190d from where the charge is, arriving in pulsed fashion, past to the output 191.

In order to read-out another row, e.g. the row E, the switch 61 is closed and the switch 62 is open, whereupon the pulse train is connected to the control line 2 associated with the row E. The potential $\phi_U$ is connected to the control line 3 of the row E which is also the control line of the adjacent row D. Thus, the row E is subjected to the same pulse shift and read-out as has already been described for the row D.

In order that it be clearly known which row is being read out, i.e. in order that because of the connection of the pulse train $\phi_t$ to the control line 2 of the row D, which is also the control line of the row C, the row C is not read-out simultaneously with the read-out of the row D, the other control lines, i.e. the control lines 2 and 3 of the row A, B and F, and thus also the control line 3 of the row C and the pulse train line 2 of the row E are connected to potentials which differ from the potentials $\phi_t$ and $\phi_U$. For example, a potential $\phi_2$ should be provided for the control lines 2, and a potential $\phi_0$ should be provided for the control lines 3. These potentials $\phi_2$ and $\phi_0$ are connected to the control lines in that for the control lines 2 the switches 22 and 62 are closed, whereas the switches 21 and 61 are open, and on the other hand for the control lines 3, the switches 32, 92 and 72 are closed, whereas the switches 31, 91 and 71 are open. A potential $\phi_2$ is connected to the line $L_2$ and a potential $\phi_0$ is connected to the line $L_4$.

For the read-out of the row E, with the above-described configurations and for the potentials $\phi$ connected to the lines $L_1$ to $L_4$, it is necessary to close the switches 61, 51, 22, 42, 92, 32, 72, whereas the switches 62, 52, 21, 41, 91, 31, 71 are open. Therefore, the row E is subjected to precisely the same read-out conditions as have already been described for the row D; in particular, the potential $\phi_t$ is connected to the control line 2 of the row E and the constant potential $\phi_U$ is connected to the control line 3 of the row E.

For the realization of the invention, however, it is also necessary to adhere to a condition, stated in the following, relating to the relationship between the potentials $\phi$. For a n-conducting substrate, the substrate potential must be greater than or equal to $\phi_0$. For this purpose, $\phi_0$ must be greater than $\phi_1$, $\phi_1$ must be greater than $\phi_U$, and $\phi_U$ must be greater than $\phi_2$. For a p-conducting substrate, the substrate potential must be smaller than or equal to $\phi_0$, and $\phi_0$ must be smaller than $\phi_1$, $\phi_1$ must be smaller than $\phi_U$ and $\phi_U$ must be smaller than $\phi_2$. The designations "smaller" and "greater" are to be understood in a mathematical sense and relate to the number from $-\infty$ to $+\infty$. Therefore, a voltage of $+1$ V can be considered to be greater than a voltage of $-3$ V, and a voltage of $-7$ V can be considered to be smaller than a voltage of $-3$ V. The substrate potential can also be equal to the potential $\phi_0$. A differing substrate potential, as stated, causes an inhomogeneous charge concentration which increases in the flow direction of the charge shift register to prevail below the electrode arrangement to which the potential $\phi_0$ is connected, as is already known for 2-phase and one-phase charge shift arrangements (CCD) in contrast to 3-phase charge shift arrangements.

An image sensor, in accordance with the invention, can be used, for example, to receive television pictures. One single image element can be realized in an area size of down to 30.30 $\mu m^2$. With this dimensioning it may be calculated that approximately 9000 image elements, i.e. image points, can be accommodated on 1 $mm^2$.

The row jump usually occurring in television pictures can be realized in a particularly simple manner in a sensor such as that constructed in accordance with the invention, and inversely, when the row jump is employed, facilitates a particularly simple design of the drive register 90a with shift registers in order to drive the switches 21–92 which are in the form of transistors. In an arrangement such as that shown schematically in FIG. 1, following the read-out of the row D and the overjumping of the row E, the row F is read-out. Therefore, in order to connect the potential $\phi_t$ and $\phi_U$ to the control lines 2 and 3 of the row F, it is only necessary to open the switch 41 which is previously closed during the read-out of the row D and to close the switch 61 in the row F which directly follows on the line $L_1$. Therefore, the pulse train $\phi_t$ is connected to the control line 2 of the row F. On the opening of the switch 41, practically simultaneously the switch 42 is closed, and practically simultaneously to the closure of the switch 61, the switch 62 which directly follows the switch 42 on the line $L_2$ is opened. In order to connect the constant potential $\phi_U$ which is required to read-out a row and which is associated with the pulse train potential $\phi_t$ on the pulse train line 2, to the pulse train line 3, following the read-out of the row D, it is only necessary to open the switch 51 and to close the switch 52, and during the readout of the row F to keep the switch 71 closed and the switch 72 open. Here again, the switches 71 and 72 are the switches which directly follow the switches 51 and 52 on the relevant line $L_3$ and $L_4$.

For a row-jump read-out of subsequent rows which are not illustrated in FIG. 1 (H, I, G, J . . . which have been omitted) on the lines $L_1$ and $L_3$ the switches of the row currently being read-out must be re-opened and the switches directly following on the lines must be closed. The switches of the lines $L_2$ and $L_4$ which are, in each case, associated with the switches to be operated of the lines $L_1$ and $L_2$ (an associated switch of this type is, e.g. the switch 62 in relation to the switch 61) must be closed in order that the potentials $\phi_2$ and $\phi_0$ may be connected to the control lines 2 and 3 of the rows which are not to be read out. As already mentioned, this constant opening and closing of the switches of the individual lines $L_1$ to $L_4$ may be effected by automatically rotating shift registers; one skilled in the art would, however, be familiar not only with these techniques, but also with the circuitry details required for their construction.

Although I have described my invention by reference to particular embodiments thereof, may changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. In an image sensor of the type having image elements arranged in a matrix, wherein each of the image elements comprises a first and a second electrode arrangement, wherein each of the image elements are photosensitive and the image elements form charge-coupled shift registers in rows, wherein all of the first electrode arrangements in each row are connected to a respective one of a plurality of first control lines and all of the second electrode arrangements of each row are connected to a respective one of a plurality of second control lines, wherein the two control lines of a row are connectible via switches to drive lines, wherein the switches are operated by drive registers, and wherein output coupling devices are provided for output coupling image information, the improvement for a single-phase mode of operation wherein:

each first control line is located between adjacent rows of image elements and is connected in common to each of said first electrode arrangements of the adjacent rows of image elements;

each second control line is located between the other adjacent rows of image elements and is connected in common to each of said second electrode arrangements of the other adjacent rows of image elements;

two pairs of drive lines each having two drive lines are provided; and a plurality of switches is provided, respective switches connecting each of said first control lines to the two drive lines of a first pair of said two pairs of drive lines and connecting each of said second control lines to the two drive lines of a second pair of said two pairs of drive lines.

2. A process for operating an image sensor of the type having image elements arranged in a matrix wherein each of the image elements comprises a first and a second electrode arrangement, wherein each of the image elements are photosensitive and the image elements form charge-coupled shift registers in rows, wherein all of the first electrode arrangements in each row are connected to a respective one of a plurality of first control lines and all of the second electrode arrangements of each row are connected to a respective one of a plurality of second control lines, wherein the two control lines of a row are connectible via switches to drive lines, wherein the switches are operated by drive registers, wherein output coupling devices are provided for output coupling image information, wherein each first control line is located between adjacent rows of image elements and is connected in common to each of the first electrode arrangements of the adjacent rows of image elements, wherein each second control line is located between other adjacent rows of image elements and is connected in common to each of the second electrode arrangements of the other adjacent rows of image elements, wherein two pairs of drive lines each having two drive lines are provided, and wherein a plurality of switches connect each of the first control lines to the two drive lines of a first pair of the two pairs of drive lines and connect each of the second control lines to the two drive lines of the second pair of the two pairs of drive lines, for a pulsed read-out of a shift register comprising image elements in a row, the improvement comprising the steps of:

applying a pulse train $\phi_t$ to one of the control lines to which one of the electrode arrangements of each of the image elements is connected;

applying a potential $\phi_U$ to the other control line to which the other electrode arrangement of each image element of a shift register is connected; and applying potentials $\phi_0$ and $\phi_2$ to the other control lines of the matrix by applying different ones of the potentials $\phi_0$ and $\phi_2$ to adjacent control lines, the pulse train potential changing at the maximum between the values $\phi_1$ and $\phi_2$, wherein the row-by-row condition applies Substrate Potential $\geq \phi_0 > \phi_1 > \phi_U > \phi_2$ for n-conducting substrate Substrate Potential $\leq \phi_0 < \phi_1 > \phi_U < \phi_2$ for p-conducting substrate wherein the mathematic symbols $>$ and $<$ relate to the number from $-\infty$ to $+\infty$.

* * * * *